(12) United States Patent
Yin et al.

(10) Patent No.: US 12,184,994 B2
(45) Date of Patent: Dec. 31, 2024

(54) IMAGE SENSING DEVICE

(71) Applicant: Guangzhou Tyrafos Semiconductor Technologies Co., Ltd., Guangzhou (CN)

(72) Inventors: Ping-Hung Yin, Hsinchu (TW); Jia-Shyang Wang, Miaoli County (TW); Jia-Sian Lyu, Pingtung County (TW); Shih-Chan Tai, Kaohsiung (TW)

(73) Assignee: Guangzhou Tyrafos Semiconductor Tech. Co., Ltd., Guangzhou (CN)

( * ) Notice: Subject to any disclaimer, the term of this patent is extended or adjusted under 35 U.S.C. 154(b) by 121 days.

(21) Appl. No.: 18/144,879

(22) Filed: May 9, 2023

(65) Prior Publication Data

US 2023/0388671 A1 Nov. 30, 2023

Related U.S. Application Data

(60) Provisional application No. 63/345,920, filed on May 26, 2022.

(51) Int. Cl.
*H04N 25/10* (2023.01)
*G06T 3/4015* (2024.01)
(Continued)

(52) U.S. Cl.
CPC .......... *H04N 25/10* (2023.01); *G06T 3/4015* (2013.01); *G06T 5/50* (2013.01); *H01L 27/0255* (2013.01);
(Continued)

(58) Field of Classification Search
CPC ........ H04N 25/10; H04N 23/13; H04N 23/45; H04N 23/52; H04N 23/56; H04N 23/73; H04N 23/74; H04N 23/741; H04N 23/815; H04N 23/951; H04N 25/11; H04N 25/134; H04N 25/135; H04N 25/47; H04N 25/50; H04N 25/533; H04N 25/535; H04N 25/58; H04N 25/59; H04N 25/75; H04N 25/77; H04N 25/771; H04N 25/78; H04N 23/70; H04N 23/75; H04N 23/76; H04N 25/583; H04N 7/0127; G06T 3/4015; G06T 5/50;
(Continued)

(56) References Cited

U.S. PATENT DOCUMENTS

2022/0014702 A1* 1/2022 Yin .................. H04N 25/707
2022/0103767 A1* 3/2022 Yin .................... H04N 25/53
(Continued)

*Primary Examiner* — Shahbaz Nazrul
(74) *Attorney, Agent, or Firm* — Lin & Associates Intellectual Property, Inc.

(57) ABSTRACT

The present invention relates to an image sensing device, including: an image sensing array, a conversion unit, and a processing circuit. The image sensing array is used to generate sensing signals of different periods. The conversion unit is used to convert the sensing signals from analog to digital. The processing circuit is used to generate a frame during an image capturing operation. The image sensing array includes a plurality of sensing sub-pixels, and the sensing sub-pixels have a sensing circuit and a storage circuit. The sensing circuit generates the sensing signals and sequentially stores the sensing signal in the storage circuit. The storage circuit sequentially outputs the sensing signals to the conversion unit.

18 Claims, 11 Drawing Sheets

(51) Int. Cl.
| | |
|---|---|
| G06T 5/50 | (2006.01) |
| H01L 27/02 | (2006.01) |
| H01L 27/146 | (2006.01) |
| H04N 23/13 | (2023.01) |
| H04N 23/45 | (2023.01) |
| H04N 23/52 | (2023.01) |
| H04N 23/56 | (2023.01) |
| H04N 23/73 | (2023.01) |
| H04N 23/74 | (2023.01) |
| H04N 23/741 | (2023.01) |
| H04N 23/80 | (2023.01) |
| H04N 23/951 | (2023.01) |
| H04N 25/11 | (2023.01) |
| H04N 25/13 | (2023.01) |
| H04N 25/47 | (2023.01) |
| H04N 25/50 | (2023.01) |
| H04N 25/533 | (2023.01) |
| H04N 25/535 | (2023.01) |
| H04N 25/58 | (2023.01) |
| H04N 25/59 | (2023.01) |
| H04N 25/75 | (2023.01) |
| H04N 25/77 | (2023.01) |
| H04N 25/771 | (2023.01) |
| H04N 25/78 | (2023.01) |

(52) U.S. Cl.
CPC .. *H01L 27/14605* (2013.01); *H01L 27/14612* (2013.01); *H01L 27/14643* (2013.01); *H04N 23/13* (2023.01); *H04N 23/45* (2023.01); *H04N 23/52* (2023.01); *H04N 23/56* (2023.01); *H04N 23/73* (2023.01); *H04N 23/74* (2023.01); *H04N 23/741* (2023.01); *H04N 23/815* (2023.01); *H04N 23/951* (2023.01); *H04N 25/11* (2023.01); *H04N 25/134* (2023.01); *H04N 25/135* (2023.01); *H04N 25/47* (2023.01); *H04N 25/50* (2023.01); *H04N 25/533* (2023.01); *H04N 25/535* (2023.01); *H04N 25/58* (2023.01); *H04N 25/59* (2023.01); *H04N 25/75* (2023.01); *H04N 25/77* (2023.01); *H04N 25/771* (2023.01); *H04N 25/78* (2023.01); *G06T 2207/20208* (2013.01); *G06T 2207/20221* (2013.01)

(58) Field of Classification Search
CPC . G06T 2207/20208; G06T 2207/20221; H01L 27/0255; H01L 27/14605; H01L 27/14612; H01L 27/14643
See application file for complete search history.

(56) References Cited

U.S. PATENT DOCUMENTS

| | | | |
|---|---|---|---|
| 2022/0150432 A1* | 5/2022 | Wang | H04N 25/78 |
| 2023/0388679 A1* | 11/2023 | Yin | H04N 23/73 |

* cited by examiner

IMAGE SENSING DEVICE

CROSS-REFERENCE TO RELATED APPLICATION

This application claims priority of U.S. provisional application No. 63/345,920, filed on May 26, 2022, the content of which is incorporated herein in its entirety by reference.

BACKGROUND OF THE INVENTION

1. Field of the Invention

The present invention relates generally to an image sensing device, and more particularly, to an image sensing device without additional digital frame buffer.

2. The Prior Arts

In recent years, the demand of the self-driving car industry has become increasingly vigorous. For self-driving cars, an image sensor for detecting real-time road conditions is an essential component. The dynamic vision sensor (DVS) is a mainstream image sensor used for detecting real-time road conditions. The reason is that the DVS records images in units of events. This dynamic event-based sensor brings machine autonomy closer to reality, making it suitable for vision-based high-speed applications in the field of autonomous vehicles.

At present, a DVS combined with a complementary metal oxide semiconductor image sensor (CMOS Image Sensor, CIS) is a type of DVS commonly used on the market. Currently, the general CIS stores the sensing signal output by the pixel unit in digital form, so the general CIS needs to be equipped with a digital frame buffer.

However, with the trend of miniaturization of electronic devices, the CIS with a digital frame buffer cannot effectively reduce the volume. In general, the image sensors used for image sensing of automobiles, medical, and surveillance cameras are small, low voltage, and low power consumption sensors. As such, how to save the space and cost of the CIS is one of the issues that developers should solve.

In addition, when driving on the road, the car may experience occasional situations where the illumination level changes drastically in a short period of time to cause partial (or all) temporary overexposure (or underexposure) of the image sensor. During this short period of time, the image recognition algorithm of the self-driving car cannot make correct object detection due to insufficient detail images, thus increasing the risk of the accidents.

Therefore, the present invention is proposed to address the above-mentioned deficiency.

SUMMARY OF THE INVENTION

A primary objective of the present invention is to provide an image sensing device having an image sensing array, a conversion unit, and a processing circuit. The image sensing array has a plurality of sensing sub-pixels, and the sensing sub-pixels have an image sensing structure. A sensing circuit of the image sensing structure generates a plurality of sensing signals and sequentially stores the sensing signals in a storage circuit, and the storage circuit sequentially outputs the sensing signals to the conversion unit; wherein the sensing signals include a first sensing signal of a first period and a second sensing signal of the second period. Thereby, the image sensing device according to the present invention can store the sensing signals in the storage circuit before the analog-to-digital conversion of the sensing signals, so as to achieve performing dynamic event detection processing without additionally setting a digital frame buffer to store sensing signals, which effectively reduces the space and cost of the image sensor.

Another objective of the present invention is to provide an image sensing device. The sensing circuit of the image sensing structure generates a plurality of sensing signals and sequentially stores the sensing signals in the storage circuit, and the storage circuit sequentially outputs the sensing signals to the conversion unit; wherein the sensing signals include a first sensing signal exposed for a first exposure time and a second sensing signal exposed for a second exposure time. As such, the present invention uses the design of the control signal to perform exposure fusion of sensing signals that are exposed at different times and with different exposure times within the same frame time, so as to achieve the effects of enhancing the definition and brightness of the moving image, so as to improve the accuracy of the recognition algorithm for identifying dynamic images to reduce the risk of accidents.

To achieve the foregoing objectives, the present invention provides an image sensing device, comprising: an image sensing array, for generating a plurality of sensing signals, the image sensing array further comprising a plurality of sensing sub-pixels, and the sensing sub-pixels having an image sensing structure; a conversion unit, coupled to the image sensing array and used for analog-to-digital conversion of the sensing signals; and a processing circuit, coupled to the conversion unit, to receive the sensing signals converted into digital signals to generate a frame during an image capturing operation; wherein, the image sensing structure comprising a sensing circuit and a storage circuit, with the sensing circuit for generating the sensing signals to be sequentially stored in the storage circuit, and the storage circuit sequentially outputting the sensing signals to the conversion unit.

Preferably, according to the image sensing device of the present invention, the sensing circuit comprises: a sensing diode; a sensing transmission circuit, coupled to the sensing diode; and a sensing reset circuit, coupled to the sensing diode; wherein, the sensing reset circuit is used to receive a sensing reset signal, and the sensing transmission circuit is used to receive a first sensing readout signal and a second sensing readout signal, the sensing reset circuit resets the charge in the sensing diode according to the sensing reset signal, the sensing transmission circuit sequentially converts the charge accumulated in the sensing diode into the sensing signals according to the first sensing readout signal and the second sensing readout signal.

Preferably, according to the image sensing device of the present invention, the storage circuit comprises: a plurality of storage diodes coupled to the sensing circuit, and the storage diodes respectively store different sensing signal; a plurality of storage transmission circuits, respectively coupled to the storage diodes; and a storage reset circuit, coupled to the storage transmission circuits; wherein, the storage reset circuit is used to receive a storage reset signal, the storage reset circuit is used to reset the storage diodes, and the storage transmission circuits respectively receive a first storage readout signal and a second storage readout signal, the storage reset circuit resets the charge in the storage diode according to the storage reset signal, and the storage transmission circuit sequentially outputs the sensing signals stored in the storage diode according to the first storage readout signal and the second storage readout signal.

Preferably, according to the image sensing device of the present invention, the sensing sub-pixels can be divided into a plurality of pixel sets, wherein the pixel sets are used to sequentially output a first sensing signal of a first period and a second sensing signal of a second period, the first sensing signal is a signal generated during the exposure for a first exposure time, and the second sensing signal is a signal generated during the exposure for a second exposure time.

Preferably, according to the image sensing device of the present invention, the timings of the sensing sub-pixels in the pixel sets outputting the first sensing signal according to the first storage readout signal and outputting the second sensing signal according to the second storage readout signal alternate with each other.

Preferably, the image sensing device according to the present invention is a dynamic vision sensor (DVS), wherein the processing circuit performs a dynamic event detection processing through the first sensing signal and the second sensing signal, wherein the first exposure time is equal to the second exposure time.

Preferably, in the image sensing device according to the present invention, the first period and the second period are equal, and the time difference between the end of the first period and the start of the second period is the same as the time difference between the end of the second period and the start of the first period.

Preferably, according to the image sensing device of the present invention, the dynamic event detection processing is to detect whether the difference between the first sensing signal and the second sensing signal falls within a light-changing interval, when falling within the light-changing interval, the processing circuit recognizes that the target object is in a moving state, and when not falling within the light-changing interval, the processing circuit recognizes that the target object is in a stationary state.

Preferably, in the image sensing device according to the present invention, the processing circuit performs exposure fusion processing on the sensing signals to generate a high dynamic range (HDR) image frame data.

Preferably, according to the image sensing device of the present invention, there is a first time difference between the sensing reset signal and the first sensing signal, and the first time difference is the first exposure time; there is a second time difference between the sensing reset signal and the second sensing signal, and the second time difference is the second exposure time; and the first exposure time and the second exposure time are not the same.

Preferably, according to the image sensing device of the present invention, each of the sensing sub-pixels has the same first exposure time, and each of the sensing sub-pixels have the same second exposure time.

Preferably, the image sensing device according to the present invention further comprises a buffer, coupled to the processing circuit, and the buffer is used to store the sensing signals.

Preferably, according to the image sensing device of the present invention, the timings of the pixel sets outputting the first sensing signal according to the first storage readout signal are earlier than those timing of outputting the second sensing signal according to the second storage readout signal.

Preferably, according to the image sensing device of the present invention, the timings of the pixel sets outputting the first sensing signal according to the first storage readout signal and outputting the second sensing signal according to the second storage readout signal alternate with each other.

Preferably, according to the image sensing device of the present invention, the image sensing array performs a first global shutter exposure operation during the first period, and the image sensing array performs a second global shutter exposure operation during the second period.

Preferably, according to the image sensing device of the present invention, the processing circuit of the sensing sub-pixels performs a first rolling readout operation, and the processing circuit of the sensing sub-pixels performs a second rolling readout operation.

In summary, the image sensing device of the present invention can generate sensing signals of different periods through the sensing circuit, store the sensing signals in the storage circuit respectively, and finally generate the difference between the sensing signals directly through the processing circuit to perform dynamic event detection processing. Therefore, the image sensing structure according to the present invention does not need to set up additional frame buffers to store sensing signals, which effectively reduces the space and cost of the image sensor. In addition, the image sensing device can also generate sensing signals with different exposure times through the sensing circuit, and store these sensing signals in the storage circuit respectively, and finally use the processing circuit to process the sensing signals at different exposure times and with different exposure times to perform exposure fusion on the signals to enhance the clarity and brightness of the moving image, so as to improve the accuracy of the recognition algorithm for recognizing the moving image and reduce the risk of accidents.

In order to make those skilled in the art understand the objectives, characteristics and effects of the present invention, the present invention is described in detail below by the following specific embodiments, and in conjunction with the attached drawings.

DETAILED DESCRIPTION OF THE PREFERRED EMBODIMENT

Figure 1:
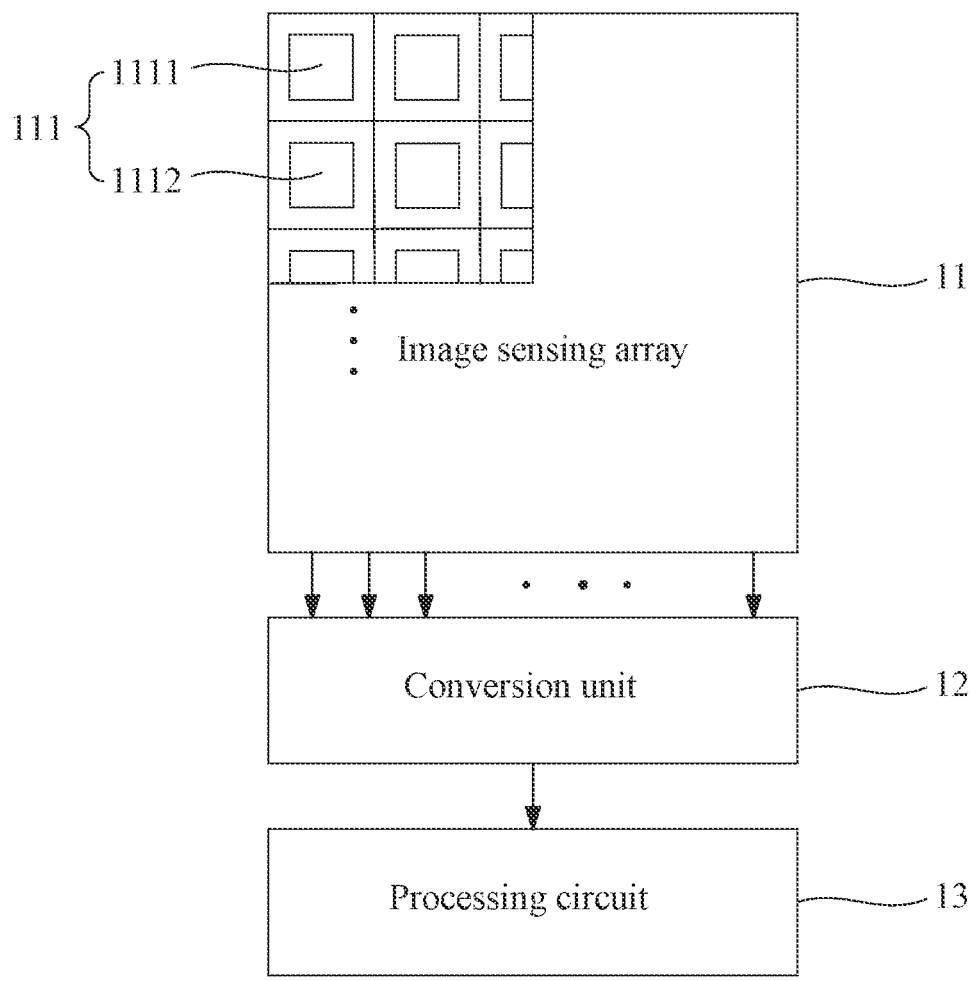
FIG. 1 is a schematic view showing an image sensing device according to the present invention.

The accompanying drawings are included to provide a further understanding of the invention, and are incorporated in and constitute a part of this specification. The drawings illustrate embodiments of the invention and, together with the description, serve to explain the principles of the invention.

The inventive concept will be explained more fully hereinafter with reference to the accompanying drawings in which exemplary embodiments of the inventive concept are shown. Advantages and features of the inventive concept and methods for achieving the same will be apparent from the following exemplary embodiments, which are set forth in more details with reference to the accompanying drawings. However, it should be noted that the present inventive concept is not limited to the following exemplary embodiments, but may be implemented in various forms. Accordingly, the exemplary embodiments are provided merely to disclose the inventive concept and to familiarize those skilled in the art with the type of the inventive concept. In the drawings, exemplary embodiments of the inventive concepts are not limited to the specific examples provided herein and are exaggerated for clarity.

The terminology used herein is used to describe particular embodiments only, and is not intended to limit the present invention. As used herein, the singular terms "a" and "the" are intended to include the plural forms as well, unless the context clearly dictates otherwise. As used herein, the term "and/or" includes any and all combinations of one or more of the associated listed items. It will be understood that when an element is referred to as being "connected" or "coupled" to another element, it can be directly connected or coupled to the other element or intervening elements may be present.

Similarly, it will be understood that when an element (e.g., a layer, region, or substrate) is referred to as being "on" another element, it can be directly on the other element or intervening elements may be present. In contrast, the term "directly" means that no intervening elements are present. It should be further understood that when the terms "comprising" and "including" are used herein, it is intended to indicate the presence of stated features, steps, operations, elements, and/or components, but does not exclude one or more other features, steps, operations, elements, components, and/or the presence or addition of groups thereof.

Furthermore, exemplary embodiments in the detailed description are set forth in cross-section illustrations that are idealized exemplary illustrations of the present inventive concepts. Accordingly, the shapes of the exemplary figures may be modified according to manufacturing techniques and/or tolerable errors. Therefore, the exemplary embodiments of the present inventive concept are not limited to the specific shapes shown in the exemplary figures, but may include other shapes that may be produced according to the manufacturing process. The regions illustrated in the figures have general characteristics and are used to illustrate specific shapes of elements. Therefore, this should not be considered limited to the scope of this creative concept.

It will also be understood that, although the terms "first," "second," "third," etc. may be used herein to describe various elements, these elements should not be limited by these terms. These terms are only used to distinguish each element. Thus, a first element in some embodiments could be termed a second element in other embodiments without departing from the teachings of the present creation. Exemplary embodiments of aspects of the present inventive concept illustrated and described herein include their complementary counterparts. Throughout this specification, the same reference numbers or the same designators refer to the same elements.

Furthermore, example embodiments are described herein with reference to cross-sectional and/or planar views, which are illustrations of idealized example illustrations. Accordingly, deviations from the shapes shown, for example, caused by manufacturing techniques and/or tolerances, are expected. Accordingly, the exemplary embodiments should not be considered limited to the shapes of the regions shown herein, but are intended to include deviations in shapes resulting from, for example, manufacturing. Thus, the regions illustrated in the figures are schematic and their shapes are not intended to illustrate the actual shape of a region of a device and are not intended to limit the scope of example embodiments.

Refer to FIG. 1, which is a schematic view of an image sensing device according to the present invention. As shown in FIG. 1, the image sensing device 100 of the present invention includes: an image sensing array 11, a conversion unit 12, and a processing circuit 13.

Specifically, in some embodiments, the image sensing device 100 of the present invention may be a complementary metal-oxide-semiconductor (CMOS) image sensor (CIS) or a charge coupled device (CCD). Moreover, in some embodiments, the image sensing device 100 may further include a memory. The memory can be used to store frame, pixel data, image analysis software or computing software, etc. described in various embodiments of the present invention. However, the present invention is not limited thereto.

Figure 2:
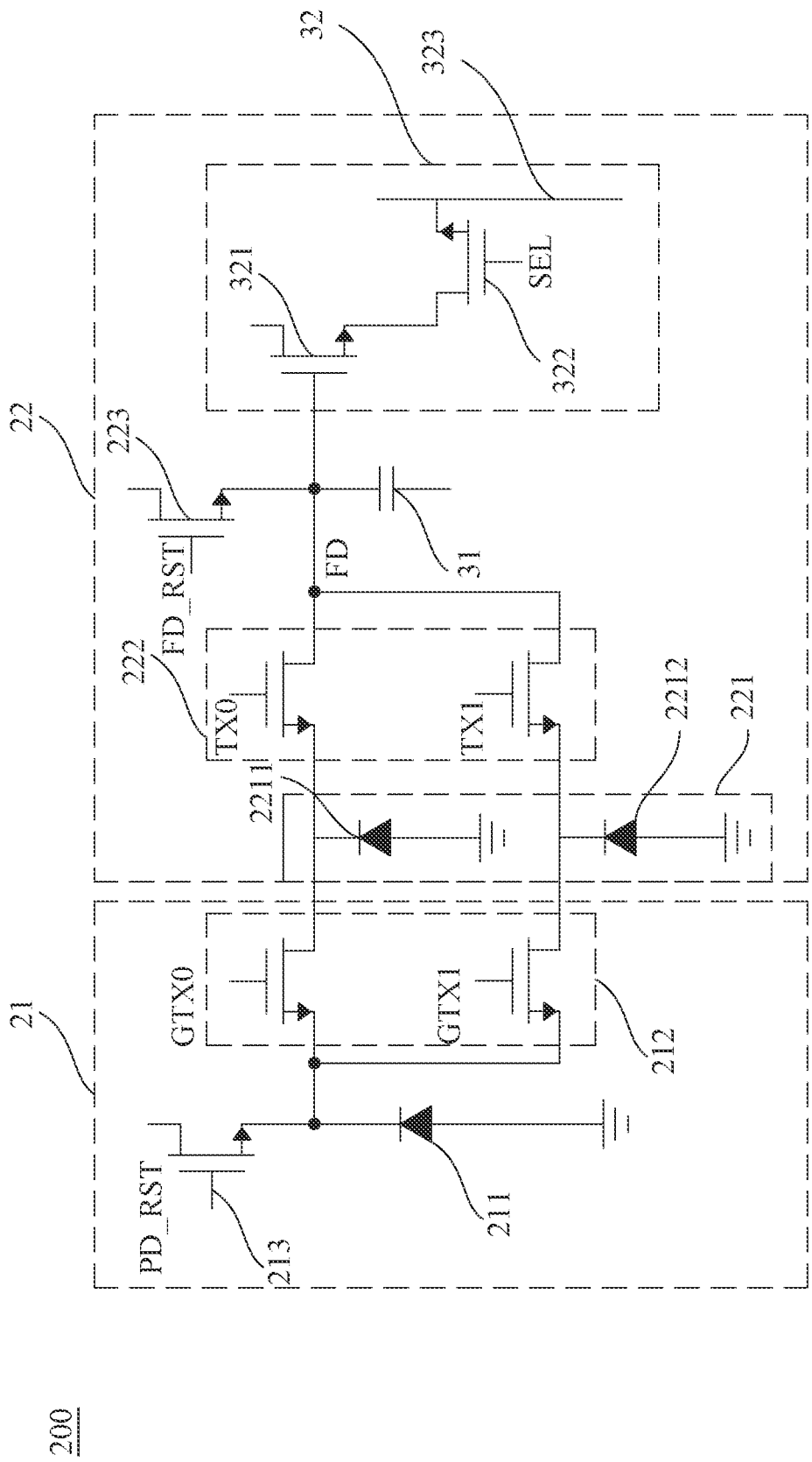
FIG. 2 is a circuit diagram of an image sensing structure according to the present invention.

Specifically, refer to FIG. 2, which is a circuit diagram of an image sensing structure according to the present invention. As shown in FIGS. 1-2, the image sensing array 11 of the present invention is used to generate a plurality of sensing signals, the image sensing array 11 includes a plurality of sensing sub-pixels 111, and the plurality of sensing sub-pixels 111 and conversion units 12 are combined into an image sensing structure 200; wherein, the image sensing structure 200 includes a sensing circuit 21 and a storage circuit 22, the sensing circuit 21 generates the sensing signals and stores the sensing signals in the storage circuit 22 sequentially, and the storage circuit 22 outputs the sensing signals sequentially to the conversion unit 12. In other words, the image sensing structure 200 located in the image sensing array 11 includes at least one sensing sub-pixel 111 of the plurality of sensing sub-pixels in the image sensing array 11; wherein each of the at least one sensing sub-pixel 111 includes a first sensing sub-pixel 1111 and a second sensing sub-pixel 1112. After the first sensing sub-pixel 1111 and the second sensing sub-pixel 1112 are combined with the conversion unit 12, the first sensing sub-pixel 1111 and the second sensing sub-pixel 1112 can respectively generate the first sensing signal in the first period and the second sensing signal in the second period, in other words, each of the at least one sensing sub-pixel 111 includes a first sensing sub-pixel 1111 and a second sensing sub-pixel 1112. After the first sensing sub-pixel 1111 and the second sensing sub-pixel 1112 are combined with the conversion unit 12, the first sensing sub-pixel 1111 and the second sensing sub-pixel 1112 are reading out sequentially. When the first sensing sub-pixel 1111 is reading out, the second sensing sub-pixel 1112 is used as a reference, and when the second sensing sub-pixel 1112 is reading out, the first sensing sub-pixel 1111 is used as a reference. Specifically, the converting unit 12 according to the present invention is coupled to the image sensing array 11, and the converting unit 12 is used for converting the sensing signals generated by the sensing sub-pixels 111 into digital pixel values. As shown in FIG. 1, in the present invention, the sensing sub-pixel 111 includes a first sensing sub-pixel 1111 and a second sensing sub-pixel 1112, because both the first sensing sub-pixel 1111 and the second sensing sub-pixel 1112 the image sensing structure 200 after being combined with the converting unit 12, the first sensing sub-pixel 1111 and the second sensing sub-pixel 1112 can respectively generate the first sensing signal in the first period T1 and the second sensing signal in the second period T2; that is, the image sensing device 100 of the present invention can generate sensing signals of different periods by only a single sub-pixel to perform dynamic event detection processing. In other words, no spatial error will be generated. It should be noted that the analog-to-digital conversion is performed on the sensing signal by the conversion unit 12, and the built-in analog-to-digital conversion circuit (ADC) can use a differential scheme circuit. Therefore, when a sensing signal is converted from analog to digital, a floating diffusion node FD in the sensing structure 200 adjacent to the row is required as a reference point, and the voltage of this reference point is reset by a voltage reset by the storage reset circuit 223. Specifically, the first sensing sub-pixel 1111 and the second sub-pixel 1112 are reading out sequentially, when the first sensing sub-pixel 1111 is reading out, the second sensing sub-pixel 1112 is used as a reference, wherein the floating diffusion node of the sensing structure 200 in the second sensing sub-pixel 1112 is only a reset charge obtained through reset by the storage reset circuit 223. By using the differential scheme circuit, better Signal-to-Noise Ratio (SNR), Power Supply Rejection Ratio (PSRR), and cancellation of pixel and circuit offset can be achieved. However, the present invention is not limited thereto.

Specifically, as shown in FIG. 2, the sensing circuit 21 of the present invention is mainly used to generate a plurality of sensing signals of different periods. In some embodiments, the sensing circuit 21 includes a sensing diode 211, a sensing transmission circuit 212, and a sensing reset circuit 213. The cathode of the sensing diode 211 is coupled to the sensing transmission circuit 212 and the sensing reset circuit 213. The sensing diode 211 is mainly used to convert the incident light into a charge (i.e., electrons) according to the intensity of the incident light, and the sensing transmission circuit 212 is mainly controlled by the sensing readout signal (GTX0, GTX1) to control the charge transmission between the sensing diode 211 and the storage circuit 22, and the sensing reset circuit 213 is mainly controlled by the sensing reset signal PD_RST to reset the charge stored in the sensing diode 211. It can be understood that the sensing circuit 21 of the present invention can generate a plurality of sensing signals of different periods through sensing the readout signal and the sensing reset signal, and store the sensing signals in the storage circuit 22 respectively. More specifically, as shown in FIG. 2, the sensing transmission circuit 212 of the present invention may include a plurality of metal-oxide-semiconductor field-effect transistors (MOS-FET) to respectively receive different sensing readout signal to enable the sensing transmission circuit 212 to sequentially transmit the sensing signals of different periods to the storage circuit 22 according to the sensing readout signal. Therefore, the image sensing structure 200 of the present invention can use the storage circuit 22 to store the two sensing signals generated by the sensing diode 211 during an image capturing operation on the target object. However, the present invention is not limited thereto.

Specifically, as shown in FIG. 2, the storage circuit 22 of the present invention is coupled to the sensing circuit 21, and the storage circuit 22 is used to store the aforementioned plurality of sensing signals. In some embodiments, the storage circuit 22 includes a storage diode 221, a storage transmission circuit 222, and a storage reset circuit 223. The cathode of the storage diode 221 is coupled to the storage transmission circuit 222. As shown in FIG. 2, the storage diode 221 includes a first storage diode 2211 and a second storage diode 2212, and the storage transmission circuit 222 and the storage reset circuit 223 are coupled to a floating diffusion node FD; wherein, the first storage diode 2211 and the second storage diode 2212 are used to store the sensing signals of different periods, and the storage transmission circuit 222 is mainly controlled by the storage readout signals TX0, TX1 to control the charge transfer between the storage diode 221 and the floating diffusion node FD. Specifically, the storage transmission circuit 222 is coupled between the storage diode 221 and the floating diffusion node FD, and is mainly controlled by the storage readout signals TX0 and TX1 to control the charge transfer between the storage diode 221 and the floating diffusion node FD. The storage reset circuit 223 is mainly controlled by the storage reset signal FD RST to reset the charge stored in the storage diode 221.

Specifically, as shown in FIG. 1 and FIG. 2, the conversion unit 12 of the present invention is coupled to the image sensing array 11, and the conversion unit 12 is used for analog-to-digital conversion of the sensing signals. More specifically, in some embodiments, the conversion unit 12 may be a column analog-to-digital converter. For each column formed by the sensing sub-pixels 111, the column analog-to-digital converter will convert the column analog sensing signal into a digital signal. In addition, the column analog-to-digital converter supplies the digital signal generated through conversion to the processing circuit 13.

Specifically, as shown in FIG. 1 and FIG. 2, the processing circuit 13 of the present invention is coupled to the conversion unit 12, and the processing circuit 13 receives the digital form of the sensing signals converted by the conversion unit 12 to generate a frame during an image capturing operation; wherein, in some embodiments, the processing circuit 13 sequentially receives the first sensing signal of the target object during the first period and the second sensing signal of the second period, so as to generate a frame during an image capturing operation through the first sensing signal and the second sensing signal. In other embodiments, the image processing circuit 13 can be any combination of an image signal processor (ISP), a central processing unit (CPU), a microprocessor, a digital signal processor (DSP), programmable logic controller (PLC), an application specific integrated circuit (ASIC), a system-on-chip (SoC) or other similar components.

It is worth mentioning that, as shown in FIG. 2, the image sensing structure 200 according to the first embodiment of the present invention may further include a coupling capacitor 31, one end of the coupling capacitor 31 is coupled to the floating diffusion node FD, and the other end of the coupling capacitor 31 is coupled to the ramp generator circuit. The coupling capacitor 31 is used to conduct a ramp signal output by the ramp generator circuit, and the signal is an AC signal. Finally, the ramp signal will be coupled and conducted to the floating diffusion node FD to facilitate the analog-to-digital converter (ADC) of conversion unit to perform signal conversion. In the present embodiment, the coupling capacitor 31 includes only one capacitor, which is coupled to the gate of an amplification transistor 321. It should be noted that the internal analog-to-digital converter (ADC) may use a differential scheme, that is, use the sensing structure 200 in the adjacent row as a reference. The floating diffusion node FD in the sensing structure 200 used as a reference only stores a reset charge obtained by the storage reset circuit 223. More specifically, when a sensing signal generated by the sensing circuit 21 passes through the storage diode 221 and the storage transfer circuit 222 to the floating diffusion node FD, the charge information of the floating diffusion node FD needs to be used in combination with other sensing signals of floating diffusion node FD in the image sensing structure 200 in adjacent rows to an analog-to-digital converter (ADC). However, the present invention is not limited thereto.

It is worth mentioning that, as shown in FIG. 2, the image sensing structure 200 according to the first embodiment of the present invention may further include an amplification selection circuit 32, and the amplification selection circuit 32 includes an amplification transistor 321, a selection transistor 322, and a signal line 323, wherein the gate of the amplification transistor 321 is coupled to the floating diffusion node FD, and the amplification transistor 321 is coupled to the signal line 323 via the selection transistor 322. When the selection transistor 322 is controlled by an external selection signal SEL to make the selection transistor 322 in the on state, the amplification transistor 321 amplifies the voltage of the floating diffusion node FD and transmits the sensing signal to the signal line 323. It should be noted that the internal ADC may use a differential scheme circuit, and the amplification transistor 321 in the amplification selection circuit 32 may be regarded as a first-stage amplification transistor of an ADC, the floating diffusion node FD is a differential input, and the other differential input is the floating diffusion node FD in the sensing structure 200 adjacent to the row. However, the present invention is not limited thereto.

In addition, in other embodiments, the image sensing device 100 according to the present invention may further include a control circuit, the control circuit is coupled to the sensing circuit 21 and the storage circuit 22 of the image sensing device 100, and the control circuit is used to generate sensing readout signal, sensing reset signal, storage readout signal, and storage reset signal. That is, the control circuit can be used to control the image sensing device 100 to generate sensing signals in the first period and the second period respectively. In addition, the aforementioned sensing readout signal, sensing reset signal, storage readout signal and storage reset signal may be, for example, pulse signals.

Figure 3:
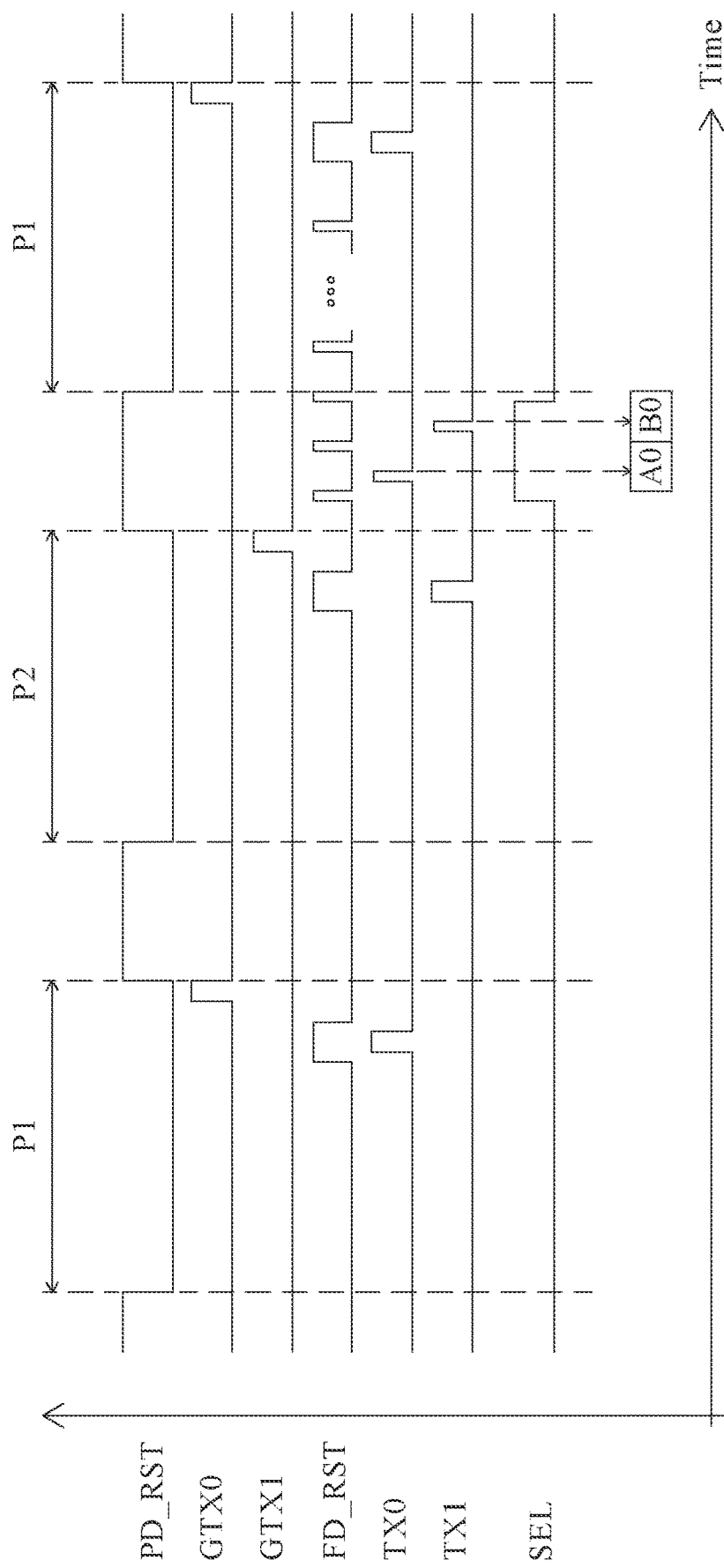
FIG. 3 is a timing diagram illustrating signals according to the present invention.

Refer to FIG. 3, together with FIG. 1 and FIG. 2. FIG. 3 is a timing diagram illustrating signals according to the present invention. In some embodiments, the image sensing device 100 can realize the first sensing signal A0 in the first period P1 and the second sensing signal B0 in the second period P2 through the signals shown in FIG. 3. The actual operation process of the image sensing device 100 is as follows: first, the sensing reset circuit 213 of the sensing circuit 21 of the present invention receives the sensing reset signal PD_RST, and the sensing transmission circuit 212 of the sensing circuit 21 receives the sensing readout signals GTX0 and GTX1 respectively, so as to use the sensing reset signal and the sensing readout signal to control the sensing diode 211 to generate a plurality of sensing signals of different periods P1 and P2. It can be understood that the sensing signals include the first sensing signal A0 in the first period P1 and the second sensing signal B0 in the second period P2. Then, the charge stored in the storage diode 221 is reset respectively through the storage reset signal FD RST in combination with storage readout signal TX0, TX1, and the sensing transmission circuit 212 is controlled by the sensing readout signals GTX0, GTX1 to respectively transfer the first sensing signal A0 and the second sensing signal B0 to the first storage diode 2211 and the second storage diode 2212 of the storage circuit 22. Then, the storage readout signals TX0, TX1 successively trigger the FET corresponding to the storage transmission circuit 222 of the storage circuit 22 to sequentially output the first sensing signal A0 and the second sensing signal B0, and output to the conversion unit 12 in combination with the external selection signal SEL. Finally, the conversion unit 12 performs analogy to digital conversion on the first sensing signal A0 and the second sensing signal B0, and a dynamic event detection process is performed on the first sensing signal A0 and the second sensing signal B0 through the processing circuit 13. In particular, the lengths of the first period P1 and the second period P2 are equal, P1=P2. The time difference from the end of P1 to the start of P2 is equal to the length of the time difference from the end of P2 to the start of P1; that is, the time difference G1 from the end of P1 to the start of P2 is equal to the time difference G2 from the end of P2 to the start of P1, G1=G2.

Figure 4:
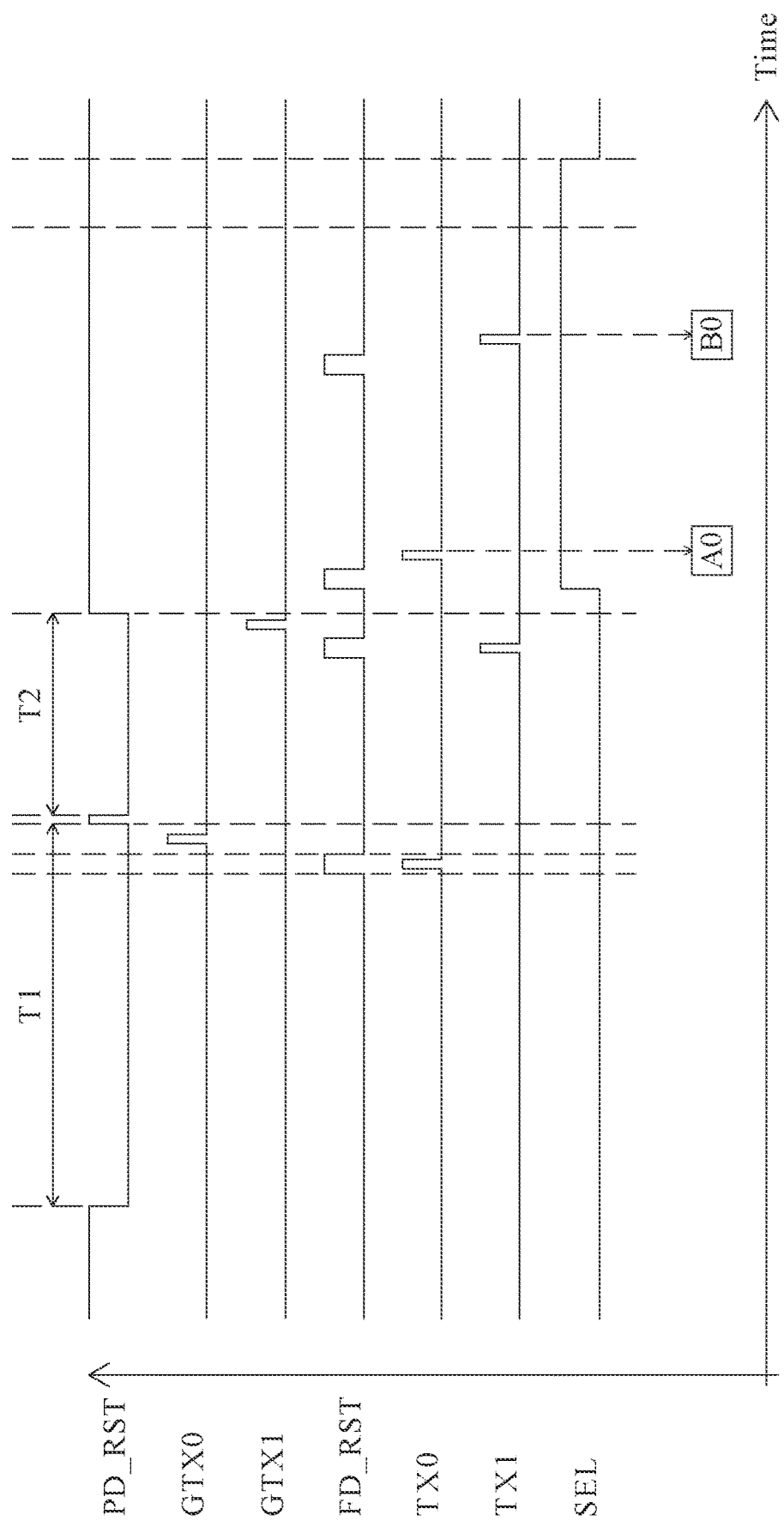
FIG. 4 is yet another timing diagram illustrating signals according to the present invention.

Refer to FIG. 4, together with FIG. 1 and FIG. 2, FIG. 4 is another timing diagram illustrating signals according to the present invention. In some embodiments, the image sensing device 100 can realize the exposure of the first sensing signal A0 for the first exposure time T1 and the second sensing signal B0 of the second exposure time T2 through the signals shown in FIG. 4. The actual execution process of the device 100 is as follows: first, the sensing reset circuit 213 of the sensing circuit 21 of the present invention receives the sensing reset signal PD_RST, and the sensing transmission circuit 212 of the sensing circuit 21 receives the sensing readout signal GTX0, GTX1 respectively to control the sensing diode 211 to generate a plurality of sensing signals with different exposure times T1 and T2 through the sensing reset signal and the sensing readout signal. It can be understood that these sensing signals include the first sensing signal A0 exposed for the exposure time T1 and the second sensing signal B0 exposed for the second exposure time T2, the first sensing signal A0 is a signal generated within the first exposure time T1, the second sensing signal B0 is a signal generated within the second exposure time T2, and the first sensing signal A0 and the second sensing signal B0 are converted into respective digital pixel values DN. Then, the charges stored in the storage diode 221 are respectively reset through the storage reset signal FD RST in combination with storage readout signals TX0, TX1, and the sensing transmission circuit 212 is controlled by the sensing readout signals GTX0, GTX1 to respectively transmit the first sensing signal A0 and second sensing signal B0 to the first storage diode 2211 and the second storage diode 2212 of the storage circuit 22. Then, the readout signals TX0 and TX1 successively trigger the FET corresponding to the storage transmission circuit 222 of the storage circuit 22 to sequentially output the first sensing signal A0 and the second sensing signal B0, and output to the conversion unit 12 in combination with the external selection signal SEL. Finally, the converting unit 12 converts the first sensing signal A0 and the second sensing signal B0 in analog-to-digital conversion, and the processing circuit 13 performs an exposure fusion processing on the first sensing signal A0 and the second sensing signal B0 to generate a frame. In particular, the lengths of the first exposure time T1 and the second exposure time T2 are not equal.

In summary, by providing different control signals, the image sensing device 100 of the present invention can respectively generate the first sensing signal A0 and the second sensing signal B0 of different periods P1, P2 or different exposure times T1, T2. When the image sensing device 100 generates the first sensing signal and the second sensing signal of different periods, the processing circuit 13 can perform dynamic event detection processing on the first sensing signal and the second sensing signal. When the image sensing device 100 generates the first sensing signal and the second sensing signal with different exposure times, the processing circuit 13 can perform exposure fusion processing on the first sensing signal and the second sensing signal to generate a high dynamic range (HDR) image frame data. That is to say, the image sensing device 100 of the present invention can be applied to a sensor based on dynamic events, so that the autonomy of the sensor is closer to the imaging mechanism of the human eye to produce a more realistic image information suitable for vision-based high-speed applications in fields such as industrial automation, consumer electronics, and self-driving cars, to achieve wide applicability. In addition, it should be particularly noted that the image sensing device 100 of the present invention does not need to wait for different sensing diodes to generate a complete frame before performing dynamic event detection processing or exposure fusion processing. Instead, the present invention can directly process the first sensing signal of a partial frame and the second sensing signal of a partial frame, which achieves fast and real-time motion image detection, and obtain high dynamic range images and other effects.

The First Embodiment

Hereinafter, the first embodiment of the image sensing device of the present invention will be described with reference to the drawings.

Figure 5:
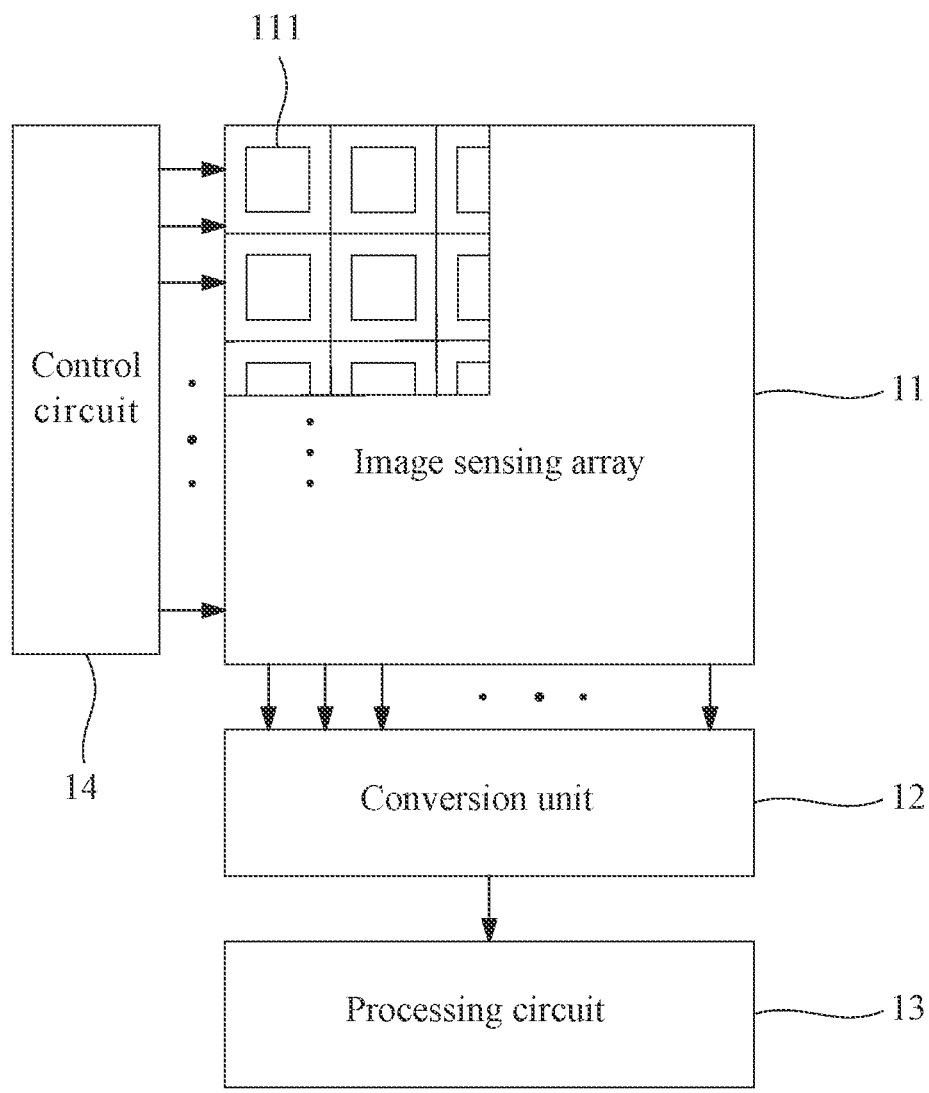
FIG. 5 is a schematic view of an image sensing device according to a first embodiment of the present invention.

Refer to FIG. 5, which is a schematic view of an image sensing device according to a first embodiment of the present invention. As shown in FIG. 5, the image sensing device 100 according to the first embodiment of the present invention includes: an image sensing array 11, a conversion unit 12, a processing circuit 13, and a control circuit 14.

Specifically, as shown in FIG. 5, the control circuit 14 according to the first embodiment of the present invention is coupled to the plurality of sensing sub-pixels 111 of the image sensing array 11, and the control circuit 14 is used to generate different control signals and the reset signals to generate the first sensing signal and the second sensing signal of different periods respectively. More specifically, as shown in FIG. 5, the control circuit 14 may include a first exposure control circuit and a second exposure control circuit (not shown), so as to respectively control the plurality of sensing sub-pixels 111 of the image sensing array 11 to generate the first sensing signal in the first period and the second sensing signal in the second period.

Figure 6:
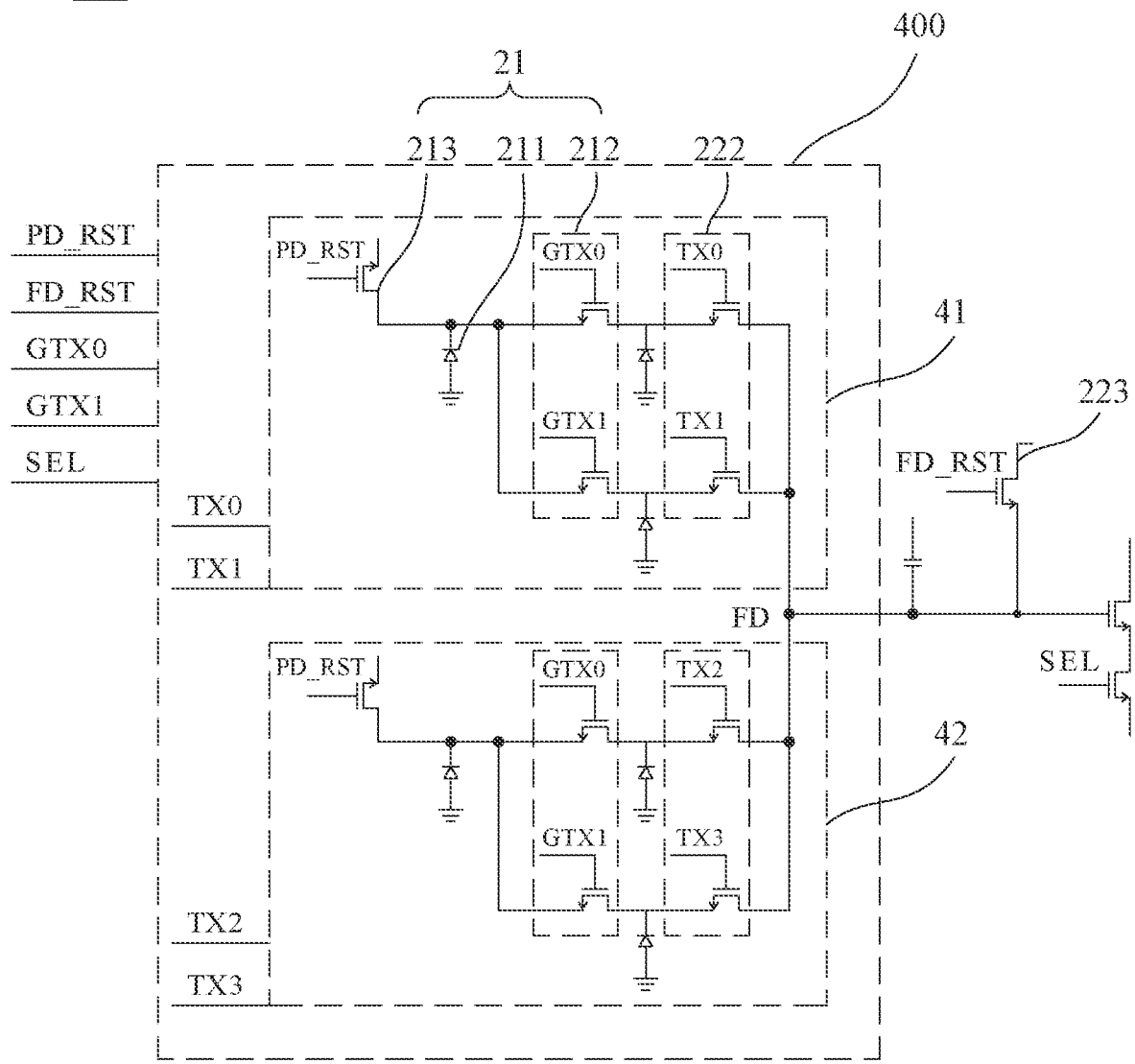
FIG. 6 is a circuit diagram of an image sensing structure according to the first embodiment of the present invention.

Specifically, refer to FIG. 6, which is a circuit diagram of an image sensing structure according to a first embodiment of the present invention. As shown in FIG. 6, the sensing sub-pixel 111 according to the first embodiment of the present invention has an image sensing structure 300, wherein the pixel sets 400 are used to sequentially output the first sensing signal in the first period and the second sensing signal in the second period during one image capturing operation. It should be further explained that, in the present embodiment, the pixel sets 400 may include a first pixel set 41 and a second pixel set 42, as shown in FIG. 6. The image sensing structures of the first pixel set 41 and the second pixel set 42 share the same floating diffusion node FD and the storage reset circuit 223, and the control circuit 14 outputs a control signal to control the storage transmission circuit 222 of the image sensing structure, so that the first pixel set 41 and the second pixel set 42 respectively output their respective first sensing signals and second sensing signals. However, the present invention is not limited thereto. The image sensing structures of the first pixel set 41 and the second pixel set 42 may also not share the same floating diffusion node FD and storage reset circuit 223.

Figure 7:
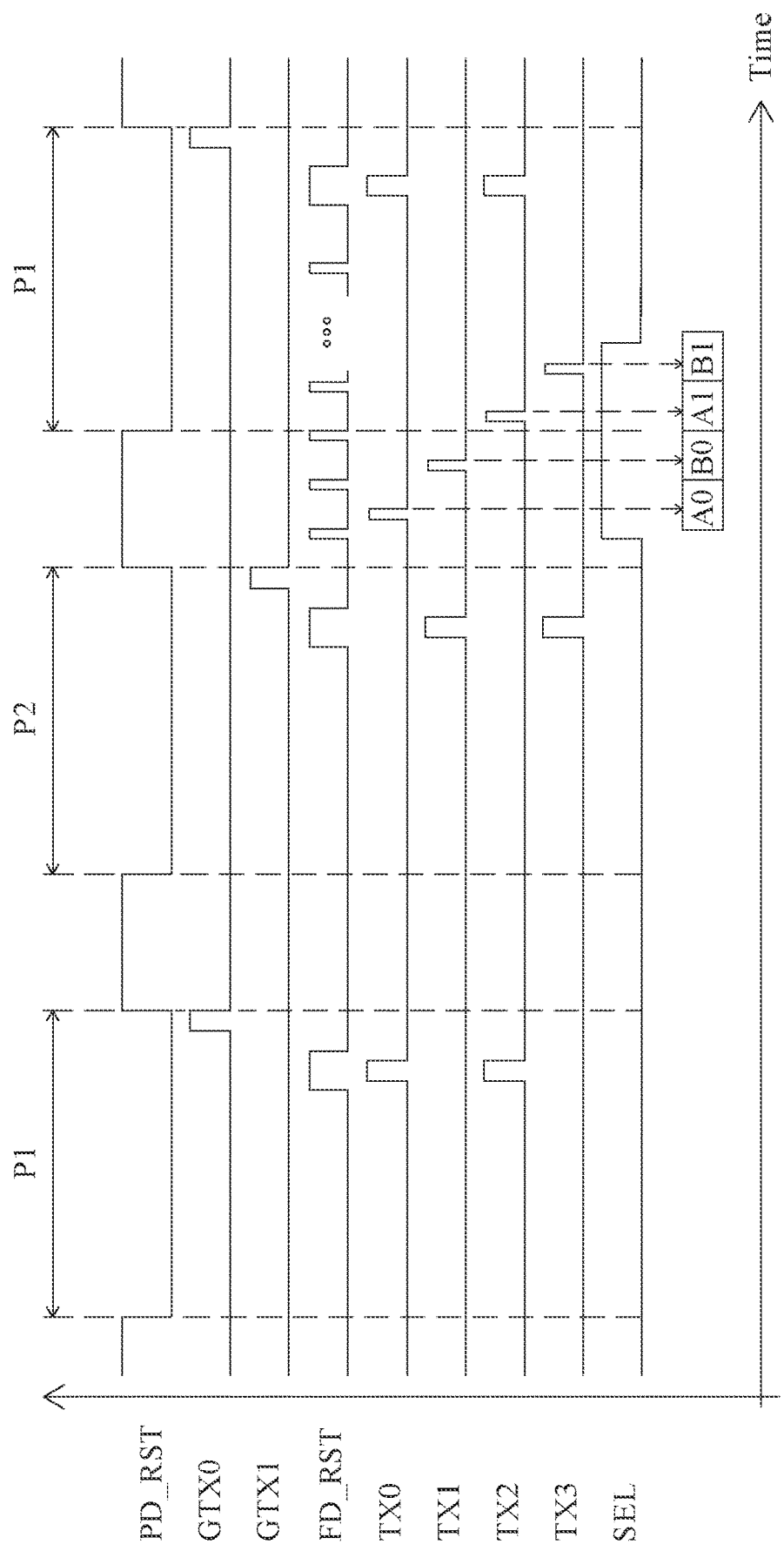
FIG. 7 is a timing diagram illustrating signals according to the first embodiment of the present invention.

Refer to FIG. 7, together with FIGS. 5-6. FIG. 7 is a timing diagram illustrating signals according to the first embodiment of the present invention. In the present embodiment, the image sensing device 100 can realize the first sensing signals A0 and A1 of the first period P1 and the second sensing signals B0 and B1 of the second period P2 through the signals shown in FIG. 7. The actual execution process of the exemplary image sensing device 100 is as follows: first, the sensing circuits 21 of the first pixel set 41 and the second pixel set 42 according to the first embodiment of the present invention receive the sensing reset signal PD_RST, and the first sensing circuits 21 of the first pixel set 41 and the second pixel set 42 respectively receive the sensing readout signals GTX0, GTX1 to control the first pixel set 41 and the second pixel set 42 through the sensing reset signal and the sensing readout signal to generate the first sensing signals A0, A1 and the second sensing signals B0, B1 of different periods P1, P2. Then, the charge stored in the diode 221 is reset respectively by the storage reset signal FD RST in combination with the storage readout signals TX0, TX1, TX2, TX3, and the sensing transmission circuit 212 is controlled by the sensing readout signals GTX0, GTX1 to respectively transmit the first sensing signal and second sensing signal to the respective first storage diode 2211 and second storage diode 2212 of the first pixel set 41 and the second pixel set 42 respectively. Then, the readout signals TX0, TX1, TX2, and TX3 successively trigger the FET corresponding to the storage transmission circuit 222 of the first pixel set 41 and the second pixel set 42 to output the first sensing signal and the second sensing signal sequentially, and outputs to the conversion unit 12 in combination with the external selection signal SEL. Finally, the conversion unit 12 converts the first sensing signals A0, A1 and the second sensing signals B0, B1 in an analog-to-digital conversion, and the processing circuit 13 performs a dynamic event detection process on the first sensing signal and the second sensing signal.

It should be noted that in FIG. 1 and FIG. 5, the image sensing array 11 includes a plurality of sensing sub-pixels 111, and the plurality of sensing sub-pixels 111 are combined with the conversion unit 12 to form an image sensing structure 200, wherein, for the first sensing signal A0 in the first period P1 and the second sensing signal B0 in the second period P2 are the sensing signals of the same sensing sub-pixel at different times, and the first sensing signals A0 and A1 are the sensing signals of different sensing sub-pixels at the same time. In other words, due to the principle of the image sensing array 11, the first sensing signal A0 can be an array row<0>element, while the second A sensing signal A1 can be an array row<1>element. Although only the first sensing signals A0 and A1 are taken as examples in the embodiment, however, based on the principle of the image sensing array 11, the sensing signals, in addition to the first sensing signal first signals A0 and A1, may also be other plurality of sensing signals A2, A3, . . . , An, wherein n is a positive integer. The second sensing signal B0 may be an array row<0>element, and the second sensing signal B1 can be an array row<1>element. Although only the second sensing signals B0 and B1 are taken as an example in the embodiment, the sensing signals can also be other plurality of sensing signals B2, B3, . . . , Bn than the second sensing signals B0 and B1, wherein n is a positive integer. Furthermore, for the image sensing array in FIG. 9, the value of n depends on the array value of the physical sensing sub-pixels of the image sensing array during implementation. The principle is the same, similar to the principles described in FIG. 1 and FIG. 5, and therefore, will not repeat them here.

Figure 8:
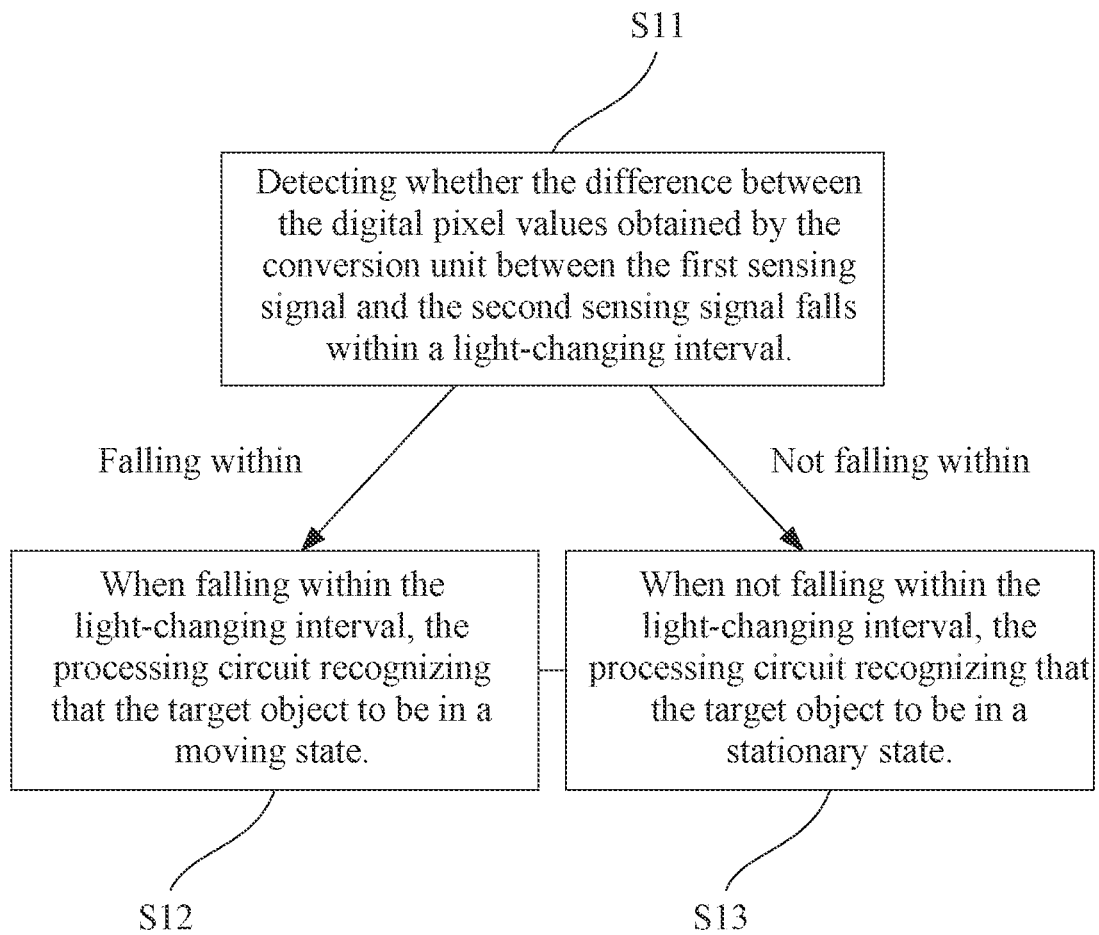
FIG. 8 is a flowchart illustrating the steps of dynamic event detection processing according to the first embodiment of the present invention.

Refer to FIG. 8. FIG. 8 is a flowchart illustrating the steps of dynamic event detection processing according to the first embodiment of the present invention. Specifically, the difference between the first sensing signals A0, A1 and the second sensing signals B0, B1 generated by the image sensing device 100 of the first embodiment of the present invention can be directly processed by the processing circuit 13 to detect dynamic events. As shown in FIG. 8, in the present embodiment, the dynamic event detection processing performed by the processing circuit 13 may include the following steps S11-S13:

Step S11: detecting whether the difference between the digital pixel values obtained by the conversion unit between the first sensing signal and the second sensing signal falls within a light-changing interval.

Step S12: When falling within the light-changing interval, the processing circuit 13 recognizing that the target object to be in a moving state.

Step S13: When not falling within the light-changing interval, the processing circuit 13 recognizing that the target object to be in a stationary state.

For example, if the digital pixel values of the two sensing signals are the same, the target object is in a stationary state; if the digital values of the two sensing signals are different, the target object is in a moving state.

It can be understood that, in the present embodiment, the pixel sets 400 include the first pixel set 41 and the second pixel set 42, since the first pixel set 41 and the second pixel set 42 both have the image sensor structure 200, the first pixel set 41 and the second pixel set 42 can respectively generate the first sensing signal in the first period P1 and the second sensing signal in the second period P2, and receive the sensing signals through the processing circuit 13 to respectively output the difference between the first sensing signal and the second sensing signal. In other words, the image sensing device 100 of the present embodiment can generate the sensing signals of different periods with only the same sensing diode through a single sub-pixel. The sensing signals are further processed for dynamic event detection. It should be noted that the first sensing signal and the second sensing signal of the present invention are generated by the same sensing diode, not by two adjacent sensing diodes, so no image resolution reduction and errors will be generated.

For example, the image sensing device 100 of the present embodiment may be a dynamic vision sensor (DVS). The dynamic vision sensor records information in units of events. When the dynamic vision sensor intends to determine whether the target object is in a dynamic event, the image sensing device 200 can directly detect the change in light intensity based on the difference between the first sensing signal and the second sensing signal. Therefore, the image sensing device 200 of the present embodiment can be a sensor based on dynamic events, so that the autonomy of the sensor is closer to the imaging mechanism of the human eye to generate more realistic image information, and therefore it is suitable for industrial automation, including wide applicability for vision-based high-speed applications in areas such as consumer electronics and autonomous vehicles.

Specifically, in the present embodiment, the plurality of sensing diodes 211 of the plurality of sensing sub-pixels sets 111 of the image sensing device 100 perform a first global shutter exposure operation during the first period T1, and the plurality of sensing diodes 211 perform a second global shutter exposure operation during the second period T2 to avoid the Jello Effect; that is, each of the sensing diodes 211 on the image sensing device 100 will be exposed at the same time. However, the plurality of processing circuits 13 of the plurality of sensing diodes 211 of the image sensing device 100 respectively output the plurality of sensing signals. The processing circuit 13 outputs the first sensing signals in a first rolling readout operation and outputs the second sensing signals in a second rolling readout operation. The first rolling readout operation and the second rolling readout operation are interlaced. However, the present invention is not limited thereto. It should be noted that since the first sensing signal and the second sensing signal are read out in an interleaved manner, it is not necessary to wait until all the rows (i.e., the complete frame) are read out to perform motion event detection or exposure fusion. Instead, when the first sensing signal and the second sensing signal of each row are read out, the dynamic event detection or exposure fusion can be performed, so the additional digital frame buffer is not needed.

In summary, the image sensing device 100 of the first embodiment of the present invention can perform dynamic event detection processing while the rolling readout operation is in progress without waiting for the completion of an entire frame of the rolling readout operation, and no additional digital frame buffer to store the first sensing signal or the second sensing signal is needed. Therefore, the image sensing device 100 can effectively save the operation steps and time of image capture performed by the image sensor when determining the dynamic event, and can effectively save the power and hardware costs of the image sensing device. Thus, the image sensing device 100 of the first embodiment can be a sensor based on dynamic events, and can effectively reduce the cost and volume of the sensor, to achieve wide applicability.

The Second Embodiment

Hereinafter, the second embodiment of the image sensing device of the present invention will be described with reference to the drawings.

Figure 9:
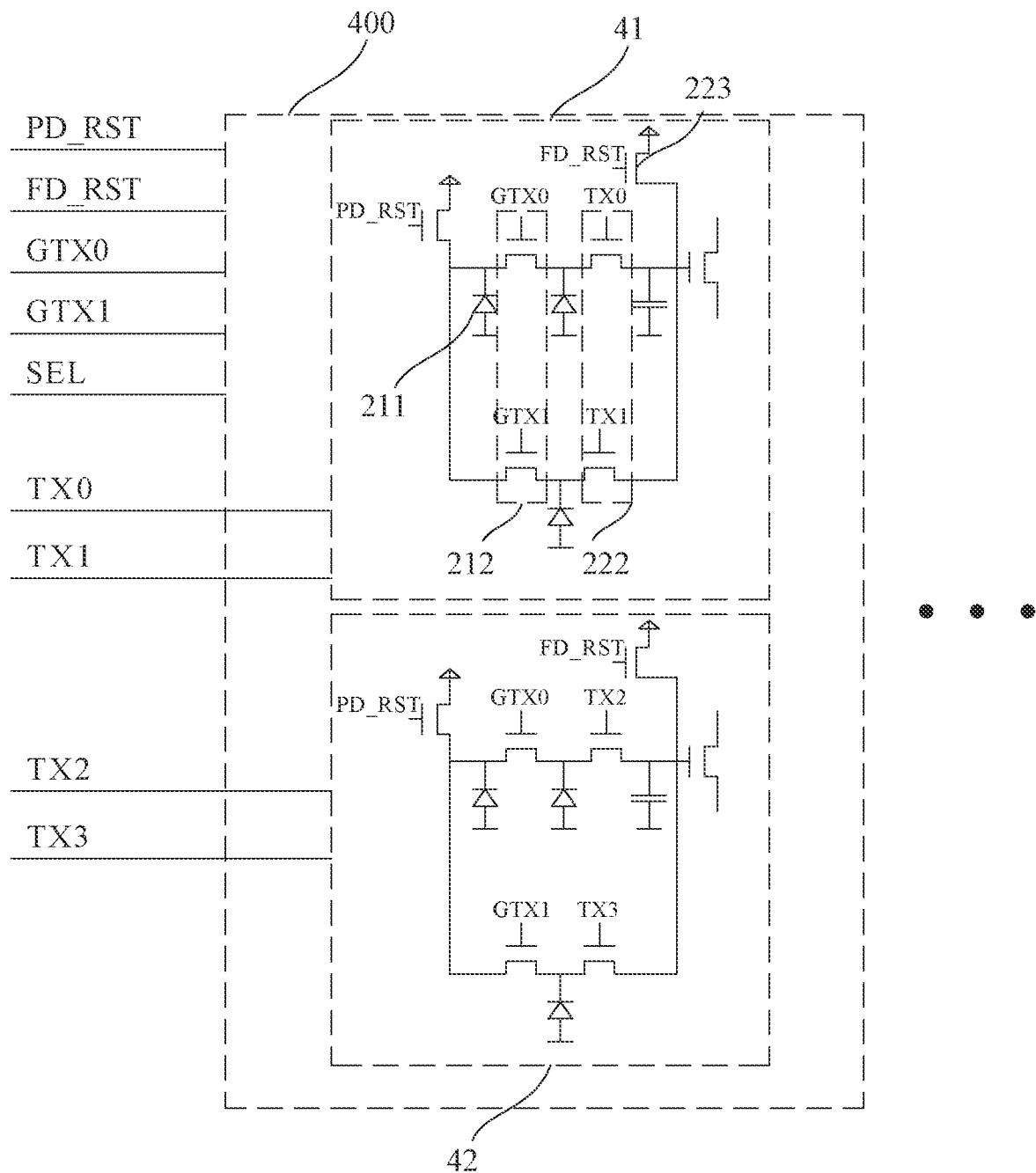
FIG. 9 is a circuit diagram of an image sensing structure according to a second embodiment of the present invention.

Refer to FIG. 9, which is a circuit diagram of an image sensing structure according to a second embodiment of the present invention. As shown in FIG. 9, the sensing sub-pixel 111 according to the second embodiment of the present invention has an image sensing structure 300, wherein the pixel sets 400 are used to sequentially output the first sensing signal of the first period and the second sensing signal of the second period during one image capturing operation. It should be further explained that, in the present embodiment, the pixel sets 400 may include a first pixel set 41 and a second pixel set 42, as shown in FIG. 9. Compared to the first embodiment, the image sensing structures of the first pixel set 41 and the second pixel set 42 have independent floating diffusion node FD and the storage reset circuit 223 respectively, and the control circuit 14 outputs a control signal to control the storage transmission circuit 222 of the image sensing structure, so that the first pixel set 41 and the second pixel set 42 respectively output their respective first sensing signals and second sensing signals of respective different exposure time. However, the present invention is not limited thereto. The image sensing structures of the first pixel set 41 and the second pixel set 42 may also share the same floating diffusion node FD and storage reset circuit 223.

Figure 10:
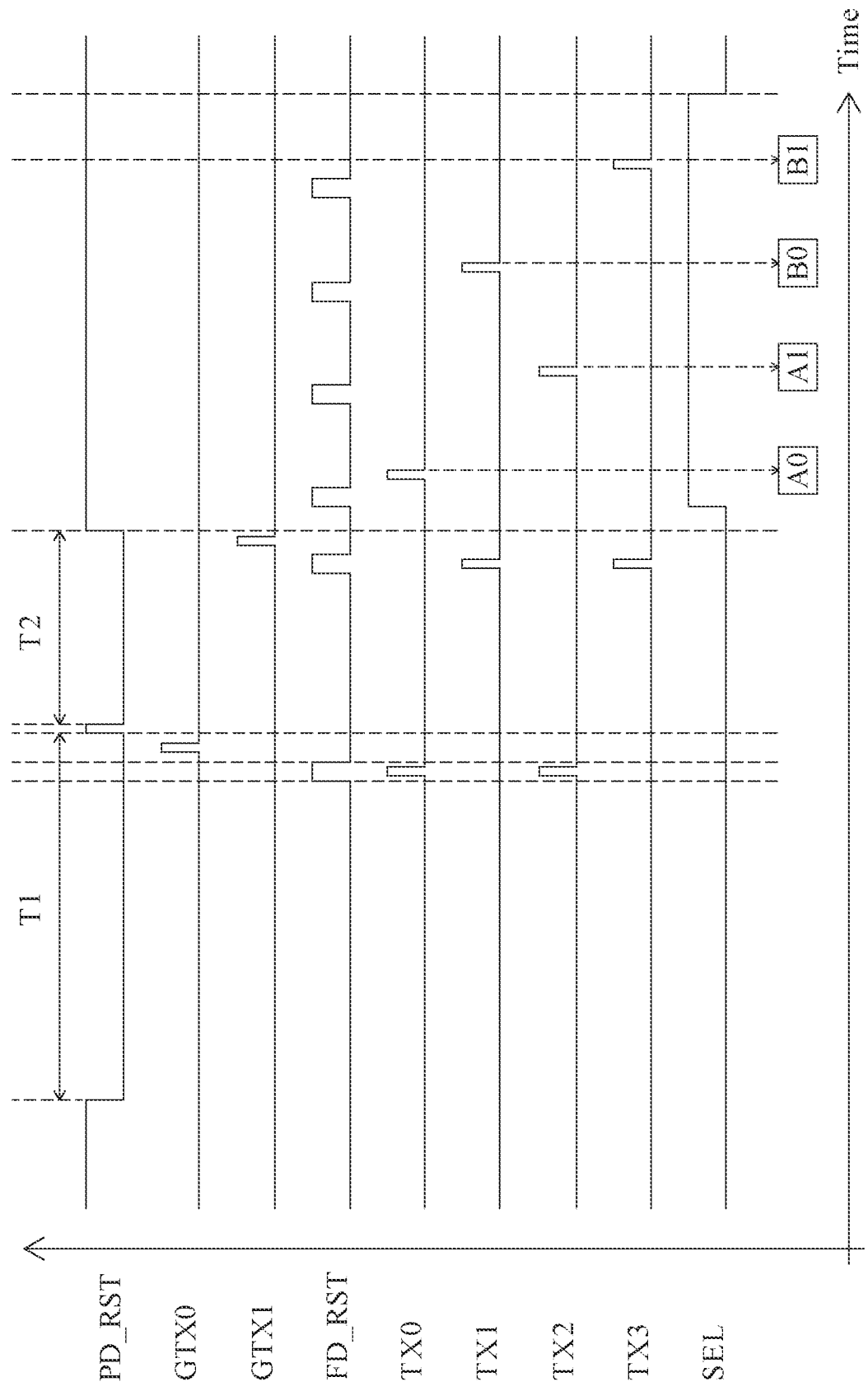
FIG. 10 is a timing diagram illustrating signals according to the second embodiment of the present invention.

Refer to FIG. 10, together with FIG. 9. FIG. 10 is a timing diagram illustrating signals according to the second embodiment of the present invention. In the present embodiment, the image sensing device 100 of the second embodiment can realize the first sensing signals A0 and A1 exposed for the first exposure time T1 and the second sensing signals B0 and B1 exposed for the second exposure time T2 through the signals shown in FIG. 710. The actual execution process of the exemplary image sensing device 100 is as follows: first, the sensing circuits 21 of the first pixel set 41 and the second pixel set 42 according to the second embodiment of the present invention receive the sensing reset signal PD_RST, and the first sensing circuits 21 of the first pixel set 41 and the second pixel set 42 respectively receive the sensing readout signals GTX0, GTX1 to control the first pixel set 41 and the second pixel set 42 through the sensing reset signal and the sensing readout signal to generate the first sensing signals A0, A1 of the first exposure time T1 and the second sensing signals B0, B1 of the second exposure time T2. As shown in FIG. 10, there is a first time difference between the sensing reset signal T PD_RST and the first sensing readout signal GTX0, and the first time difference is the first exposure time T1; there is a second time difference between the sensing reset signal PD_RST and the second sensing readout signal GTX1, and the second time difference is the second exposure time T2. Then, the charge stored in the diode 221 is reset respectively by the storage reset signal FD RST in combination with the storage readout signals TX0, TX1, TX2, TX3, and the sensing transmission circuit 212 is controlled by the sensing readout signals GTX0, GTX1 to respectively transmit the first sensing signal and second sensing signal to the respective first storage diode 2211 and second storage diode 2212 of the first pixel set 41 and the second pixel set 42 respectively. Then, the readout signals TX0, TX1, TX2, and TX3 successively trigger the FET corresponding to the storage transmission circuit 222 of the first pixel set 41 and the second pixel set 42 to output the first sensing signal and the second sensing signal sequentially, and outputs to the conversion unit 12. Finally, the conversion unit 12 converts the first sensing signals A0, A1 and the second sensing signals B0, B1 in an analog-to-digital conversion, and the processing circuit 13 performs an exposure fusion processing on the first sensing signal and the second sensing signal to generate a frame.

It should be further explained that the exposure fusion processing involved is based on the first sensing signals A0, A1 and the second sensing signals B0, B1, and the exposure fusion processing generally includes preprocessing, transformation, synthesis, and inverse transformation. Preprocessing generally refers to preparation operations before exposure fusion, which will not be repeated here. The transformation in the exposure fusion processing generally include one or any combination of the Principal Component Analysis (PCA) method, Intensity-Hue-Saturation (HIS) transformation method, wavelet transformation method, multi-resolution methods, such as Laplacian pyramid fusion algorithm, etc. The synthesis in the exposure fusion processing refers to the comprehensive processing of the transformation results of the first sensing signals A0, A1 and the second sensing signals B0, B1. There are synthesis methods can be used, such as selection method, weighted average method, optimization method, etc., wherein, the selection method is to select the corresponding transformation coefficients from the original image sequence to form a new set of transformation coefficients, and the weighted average method determines the weight of the transformation coefficients corresponding to the image signal following specific rules, and a new coefficient is generated through weighted average operation. The inverse transformation in the exposure fusion processing refers to performing a corresponding inverse operation on the new transformation coefficients of the image signal after synthesis, such as inverting the radiance map from the existing image to generate the final fused image. However, the present invention is not limited thereto.

More specifically, the aforementioned time difference is the sensing sub-pixel 111 start integration time and end integration time (i.e., equivalent to the exposure time), as shown in FIG. 10. In the present embodiment, the first time difference is the first exposure time T1, the second time difference is the second exposure time T2. It is worth mentioning that, according to the signal timing diagram shown in FIG. 10, referring to the timing of storage reading signals TX0, TX1, TX2, and TX3, it can be seen that the storage circuits 22 of the first pixel set 41 and the second pixel set 42 are first outputting the first sensing signals A0, A1, and then outputting the second sensing signals B0, B1 the conversion unit 12. In other words, the timings of the first pixel set 41 and the second pixel set 42 outputting the first sensing signals A0, A1 are all earlier than the timings of outputting the second sensing signals B, B1 according to the storage readout signals TX0, TX1, TX2, TX3. Therefore, the image sensing device 100 of the second embodiment of the present invention may further include a frame buffer coupled to the processing circuit 13, and the buffer may be used to store the first sensing signals A0, A1 which is output first to facilitate the processing circuit 13 to perform an exposure fusion processing on the first output first sensing signals A0, A1 and the later output second sensing signals B0, B1 to generate a high dynamic range image frame. However, the present invention is not limited thereto.

Figure 11:
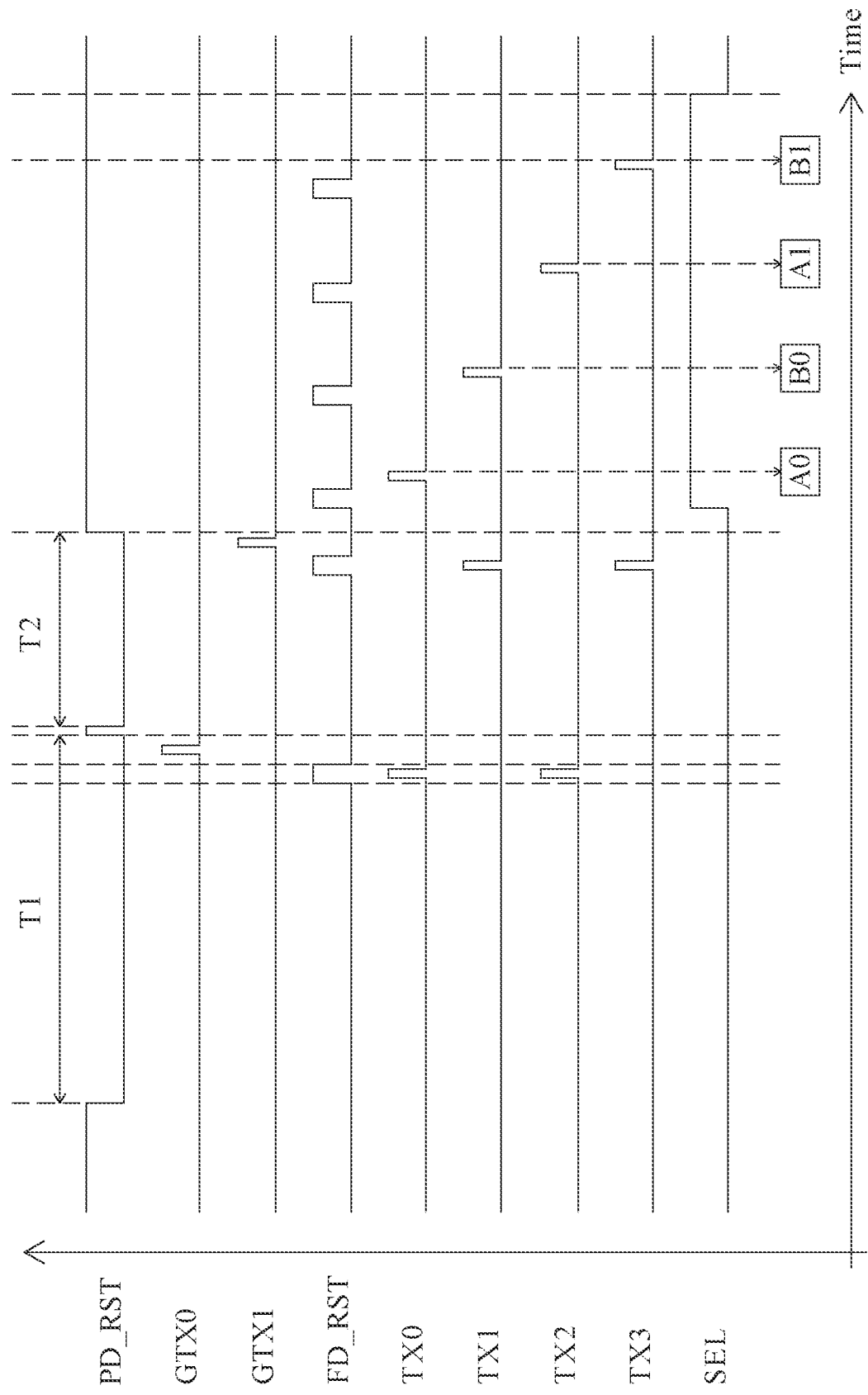
FIG. 11 is another timing diagram illustrating signals according to the second embodiment of the present invention.

Refer to FIG. 11. FIG. 11 is another timing diagram illustrating signals according to the second embodiment of the present invention. In the present embodiment, the image sensing device 100 of the second embodiment can realize the first sensing signal A0, A1 exposed for the first exposure time T1 and the second sensing signal exposed for the second exposure time T2 through the signals shown in FIG. 11. Compared with the signal timing diagram shown in FIG. 10, it can be seen by referring to the timing diagram of the storage readout signals TX0, TX1, TX2, and TX3 shown in FIG. 11, the first pixel set 41 outputs the first sensing signal A0 and the second sensing signal B0 to the conversion unit 12, and then the second pixel set 42 outputs the first sensing signal A1 and the second sensing signal B1 to the conversion unit 12. That is, the timings of the first pixel set 41 and the second pixel set 42 outputting the first sensing signal and the timing of outputting the second sensing signal are interleaved according to the timings of the storage readout signals TX0, TX1, TX2, and TX3. Therefore, by adjusting the timings of storage readout signals TX0, TX1, TX2, and TX3, the image sensing device 100 of the second embodiment of the present invention does not need to use an additional buffer, but can directly store the first sensing signal A0 and the second sensing signal B0 or the first sensing signal A1 and the second sensing signal B1 for exposure fusion. Thus, through a single sensing diode 211, image information that is exposed at different times and with different exposure times can be exposure-fused, to generate a high dynamic range image frame to achieve the effects of enhancing the clarity and brightness of the image, while effectively reducing the space and cost of the image sensor. However, the present invention is not limited thereto.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. An image sensing device, comprising:
   an image sensing array, for generating a plurality of sensing signals, the image sensing array further comprising a plurality of sensing sub-pixels, and the sensing sub-pixels having an image sensing structure;
   a conversion unit, coupled to the image sensing array and used for analog-to-digital conversion of the sensing signals; and
   a processing circuit, coupled to the conversion unit, to receive the sensing signals converted into digital signals to generate a frame during an image capturing operation;
   wherein, the image sensing structure comprising a sensing circuit and a storage circuit, with the sensing circuit for generating the sensing signals to be sequentially stored in the storage circuit, and the storage circuit sequentially outputting the sensing signals to the conversion unit.

2. The image sensing device according to claim 1, wherein the sensing circuit comprises:
   a sensing diode; a sensing transmission circuit, coupled to the sensing diode; and
   a sensing reset circuit, coupled to the sensing diode;
   wherein, the sensing reset circuit is used to receive a sensing reset signal, and the sensing transmission circuit is used to receive a first sensing readout signal and a second sensing readout signal, the sensing reset circuit resets the charge in the sensing diode according to the sensing reset signal, the sensing transmission circuit sequentially converts the charge accumulated in the sensing diode into the sensing signals according to the first sensing readout signal and the second sensing readout signal.

3. The image sensing device according to claim 2, wherein the storage circuit comprises:
   a plurality of storage diodes coupled to the sensing circuit, and the storage diodes respectively store different sensing signal;
   a plurality of storage transmission circuits, respectively coupled to the storage diodes; and
   a storage reset circuit, coupled to the storage transmission circuits;
   wherein, the storage reset circuit is used to receive a storage reset signal, the storage reset circuit is used to reset the storage diodes, and the storage transmission circuits respectively receive a first storage readout signal and a second storage readout signal, the storage reset circuit resets the charge in the storage diode according to the storage reset signal, and the storage transmission circuit sequentially outputs the sensing signals stored in the storage diode according to the first storage readout signal and the second storage readout signal.

4. The image sensing device according to claim 3, wherein the sensing sub-pixels are divided into a plurality of pixel sets, wherein the pixel sets are used to sequentially output a first sensing signal of a first period and a second sensing signal of a second period, the first sensing signal is a signal generated during the exposure for a first exposure time, and the second sensing signal is a signal generated during the exposure for a second exposure time.

5. The image sensing device according to claim 4, wherein the timings of the sensing sub-pixels in the pixel sets outputting the first sensing signal according to the first storage readout signal and outputting the second sensing signal according to the second storage readout signal alternate with each other.

6. The image sensing device according to claim 5, wherein the image sensing device is a dynamic vision sensor (DVS), wherein the processing circuit performs a dynamic event detection processing through the first sensing signal and the second sensing signal, wherein the first exposure time is equal to the second exposure time.

7. The image sensing device according to claim 6, wherein the first period and the second period are equal, and the time difference between the end of the first period and the start of the second period is the same as the time difference between the end of the second period and the start of the first period.

8. The image sensing device according to claim 6, wherein the dynamic event detection processing is to detect whether the difference between the first sensing signal and the second sensing signal falls within a light-changing interval, when falling within the light-changing interval, the processing circuit recognizes that the target object is in a moving state, and when not falling within the light-changing interval, the processing circuit recognizes that the target object is in a stationary state.

9. The image sensing device according to claim 4, wherein the processing circuit performs exposure fusion processing on the sensing signals to generate a high dynamic range (HDR) image frame data.

10. The image sensing device according to claim 9, wherein there is a first time difference between the sensing reset signal and the first sensing signal, and the first time difference is the first exposure time; there is a second time difference between the sensing reset signal and the second sensing signal, and the second time difference is the second exposure time.

11. The image sensing device according to claim 9, wherein there is a first time difference between the sensing reset signal and the first sensing signal, and the first time difference is the first exposure time; there is a second time difference between the sensing reset signal and the second sensing signal, and the second time difference is the second exposure time; and the first exposure time and the second exposure time are not the same.

12. The image sensing device according to claim 10, wherein each of the sensing sub-pixels has the same first exposure time, and each of the sensing sub-pixels have the same second exposure time.

13. The image sensing device according to claim 9, further comprising a buffer, coupled to the processing circuit, and the buffer being used to store the sensing signals.

14. The image sensing device according to claim 13, wherein the timings of the pixel sets outputting the first sensing signal according to the first storage readout signal are earlier than those timing of outputting the second sensing signal according to the second storage readout signal.

15. The image sensing device according to claim 9, wherein the timings of the pixel sets outputting the first sensing signal according to the first storage readout signal and outputting the second sensing signal according to the second storage readout signal alternate with each other.

16. The image sensing device according to claim 4, wherein the image sensing array performs a first global shutter exposure operation during the first period, and the image sensing array performs a second global shutter exposure operation during the second period.

17. The image sensing device according to claim 16, wherein the processing circuit of the sensing sub-pixels performs a first rolling readout operation, and the processing circuit of the sensing sub-pixels performs a second rolling readout operation.

18. The image sensing device according to claim 3, wherein the image sensing structure comprises
at least one sensing sub-pixel of a plurality of sensing sub-pixels in the image sensing array, wherein each of the at least one sensing sub-pixel comprises a first sensing sub-pixel and a second sensing sub-pixel; after the first sensing sub-pixel and the second sensing sub-pixel are combined with the conversion unit, the first sensing sub-pixel and the second sensing sub-pixel respectively generate the first sensing signal during the period and the second sensing signal during the second period;
wherein, the sensing transmission circuit comprises a plurality of metal-oxide-semiconductor field-effect transistors (MOSFET) to respectively receive different sensing readout signals, so that the sensing transmission circuit sequentially transmits different sensing signals of different periods to the storage circuit according to the different sensing readout signals, and the storage circuit has a plurality of storage diodes for storing the sensing signals;
wherein, the storage circuit is located in the image sensing array, the storage transmission circuit comprises a plurality of MOSFETs, and is coupled to a floating diffusion node;
wherein, the image sensing structure is coupled to the conversion unit and is coupled to the conversion unit and forms a differential scheme analog-to-digital converter with the image sensing structure of the adjacent row for performing analog-to-digital conversion to obtain better signal-to-noise ratio (SNR), power supply rejection ratio (PSRR) and offset cancellation; and
wherein, the image sensing structure is equipped with a ramp generator circuit, coupled to the floating diffusion node via a coupling capacitor, and the ramp generator circuit is used to convert the voltage signal of the floating diffusion node from analog to digital.

* * * * *